US005711891A

United States Patent [19]

Pearce

[11] Patent Number: 5,711,891

[45] Date of Patent: Jan. 27, 1998

[54] WAFER PROCESSING USING THERMAL NITRIDE ETCH MASK

[75] Inventor: Charles Walter Pearce, Emmaus, Pa.

[73] Assignee: Lucent Technologies Inc., Murray Hill, N.J.

[21] Appl. No.: 531,115

[22] Filed: Sep. 20, 1995

[51] Int. Cl.[6] .............................. H01L 21/033; B41J 2/16

[52] U.S. Cl. ................................ 216/51; 216/27; 216/99; 156/659.11

[58] Field of Search .............................. 216/2, 27, 5, 56, 216/99; 156/659.11

[56] References Cited

U.S. PATENT DOCUMENTS

| | | | |
|---|---|---|---|
| 4,266,985 | 5/1981 | Ito et al. | 437/914 |
| 4,277,320 | 7/1981 | Beguwala et al. | 437/242 |
| 4,298,629 | 11/1981 | Nozaki et al. | 437/242 |
| 4,957,592 | 9/1990 | O'Neill | 216/27 |
| 5,068,006 | 11/1991 | Fisher | 216/99 |
| 5,201,987 | 4/1993 | Hawkins et al. | 216/27 |
| 5,308,442 | 5/1994 | Taub et al. | 216/51 |
| 5,385,635 | 1/1995 | O'Neill | 216/27 |
| 5,518,946 | 5/1996 | Kuroda | 437/241 |

FOREIGN PATENT DOCUMENTS

| | | |
|---|---|---|
| 525650 A2 | 2/1993 | European Pat. Off. . |
| 61-279689 | 12/1986 | Japan . |
| 63-253671 | 10/1988 | Japan . |

OTHER PUBLICATIONS

Moslehi et al. "Electrical characteristics of devices fabricated with ultrathin thermally grown silicon nitride and nitroxide" 1983 Sumposium on VLSI technology. Dig. of Technical Papers, pp. 92–93.

Habraken et al. "Characterization of low-pressure chemical vapor deposited and thermally grown silicon nitride films" J. Appl Phys. 53 (1) pp. 404–415.

*Primary Examiner*—R. Bruce Breneman
*Assistant Examiner*—Anita Alanko

[57] ABSTRACT

A method for forming v-shaped grooves in a substrate such as a channel plate is disclosed. A mask of silicon nitride formed by a thermal nitridation process protects the substrate during KOH etching.

8 Claims, 3 Drawing Sheets

WAFER PROCESSING USING THERMAL NITRIDE ETCH MASK

TECHNICAL FIELD

This invention relates to methods for wafer processing.

BACKGROUND OF THE INVENTION

Many modern inkjet printers utilize a module such as that represented by reference numeral 20 in FIG. 1. Module 20 comprises two substrates denoted by reference numerals 11 and 19. Illustratively, substrates 11 and 19 are formed from single crystal silicon. Substrate 11, often termed the "channel plate" contains plurality of v-shaped grooves, two of which are denoted by reference numerals 13 and 15. In addition, substrate 11 also contains a plurality of channels, one of which is denoted by reference numeral 17. Channels 17 (which may have sloping sides) extend completely through substrate 11.

Substrate 19 contains a plurality of heating elements, two of which are denoted by reference numerals 21 and 23. Substrate 19 is termed "heater plate." (Illustratively, heating elements 21 and 23 may comprise an upper layer of metal such as, tantalum overlying a layer of silicon nitride and a layer of polysilicon. The polysilicon is heated by the passage of current, thereby causing heating of the upper layer of metal). Heating elements 21 and 23 are surrounded and partially covered by an insulating layer 24, typically polyimide. Insulator 24 defines small cavities 25 and 26 above heating elements 21 and 23 respectively. Substrates 11 and 19 are mated together. V-groove 15 together with small cavity 25, together thereby define a passageway for ink. Similarly, v-groove 13, together with cavity 26 also thereby defines another passageway for ink. Energization of heating elements 21 and 23 causes heating of the ink, thereby causing the ink to flow. Channel 17 extends through substrate 11, thereby providing a conduit for an ink reservoir (not shown) and also provides a connection to v-grooves 15 and 13 (although not explicitly shown in the figure).

Methods for forming v-grooves and channels in silicon substrates will now be discussed. In FIG. 2, reference numeral 111 denotes a substrate which may be silicon, doped silicon, epitaxial silicon, etc. Reference numeral 131 denotes a patterned oxide, typically, a thermal oxide. Reference numeral 132 denotes a blanket layer of silicon nitride typically formed by a plasma enhanced CVD (chemical vapor deposition) process, or a low pressure CVD process. Nitride layer 132 is patterned to produce opening 133. An etching process, typically, a KOH etching process is performed to create channel 117.

Next, turning to FIG. 3, nitride layer 132 (not shown in FIG. 3) is stripped and wafer 111 is subjected to a second chemical etch in KOH. The KOH etch tends to produce v-shaped grooves 113 and 115 (because, as is known to those skilled in the art, the KOH etchant tends to attack silicon planes with a orientation, and stop on planes with a [111] orientation). However, as illustrated more particularly in the enlargement A in FIG. 4, the KOH etchant tends to also attack patterned oxide 131. Consequently, the initially defined edge, 134, of oxide 131 is etched back to a subsequent position denoted by reference numeral 135. Consequently, the initially-defined v-groove 1151 becomes larger, as denoted by reference numeral 1152.

Those concerned with the development of v-groove etching in general, and the effective fabrication of channel plates have sought improved methods for etching process control.

SUMMARY OF THE INVENTION

The above-mentioned concerns are addressed by the present invention which illustratively includes:

forming a layer of silicon nitride by a thermal nitridation process upon a silicon substrate;

patterning said layer of silicon nitride to expose portions of the substrate; and etching the exposed portions of the substrate to produce at least one v-shaped groove.

DETAILED DESCRIPTION

Figure 5:
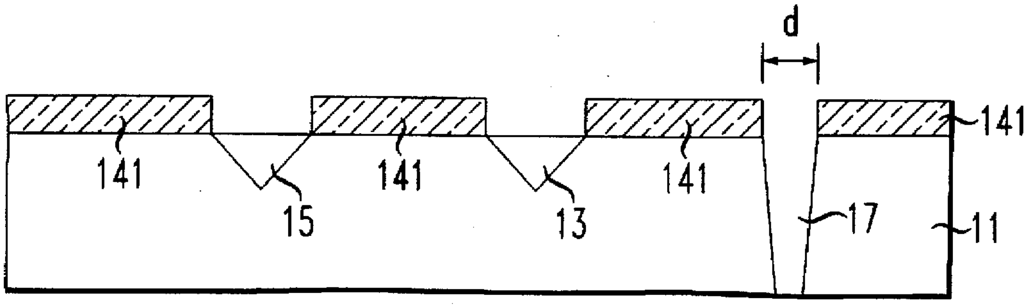
FIG. 5 depicts a first embodiment of the present invention with a patterned thermal silicon nitride layer.

In FIG. 5, reference numeral 11 denotes a substrate which is typically, silicon, epitaxial silicon, or doped silicon. Typically, 11 is a portion of a wafer similar to wafers used to fabricate integrated circuits. Reference numeral 141 denotes a patterned silicon nitride layer. Layer 141 is formed by a thermal nitridation process. In the thermal nitridation process, wafer 11 is exposed to an ammonia ambient, alternatively, a nitrogen ambient, (or a combination of both ammonia and nitrogen) at a temperature between 900° C. and 1200° C. at atmospheric pressure. The thermal nitridation process produces a layer of silicon nitride which is in direct and intimate contact with the silicon substrate 11, i.e., there is no intermediate layer of oxide between layer 141 and substrate 11. Other processes for forming silicon nitride, such as plasma enhanced chemical wafer deposition (PECVD) or low pressure chemical vapor deposition (LPCVD) are not as suitable for forming silicon nitride layer 141 because the presence of residual oxygen in the reaction chamber permits the formation of an intermediate, but thin, layer of oxide between layer 141 and substrate 11. However, the thermal nitridation process described above displaces oxygen which may be present at the interface between layer 141 and substrate 11. Thus the thermal nitridation process may be performed on wafers which may have a pre-existing oxide layer.

Figure 1:
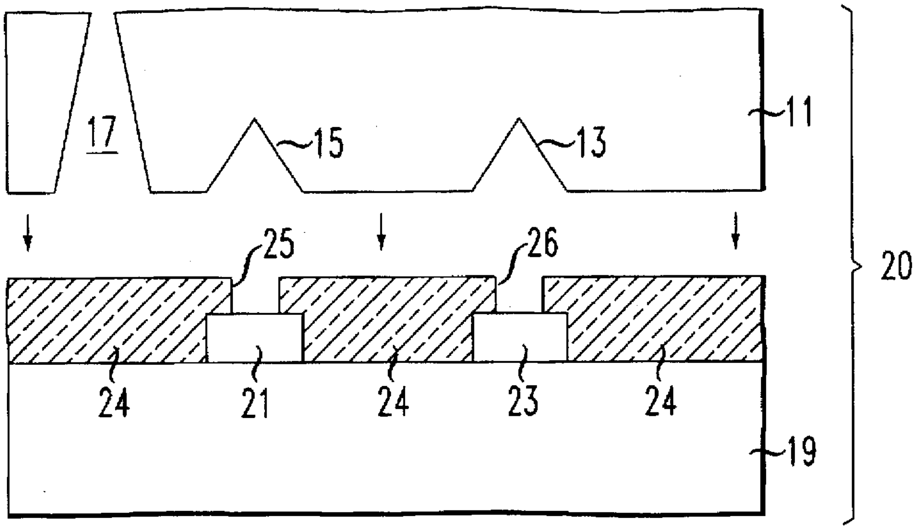
FIG. 1 depicts a conventional ink jet module.
Figure 2:
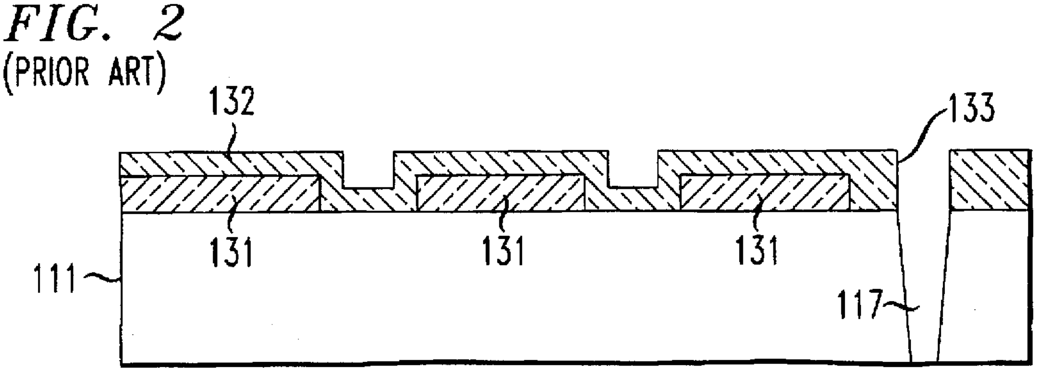
FIG. 2 (PRIOR ART)
FIGS. 2 and 3 depict a conventional method of forming v-grooves or channels in silicon substrates.
Figure 3:
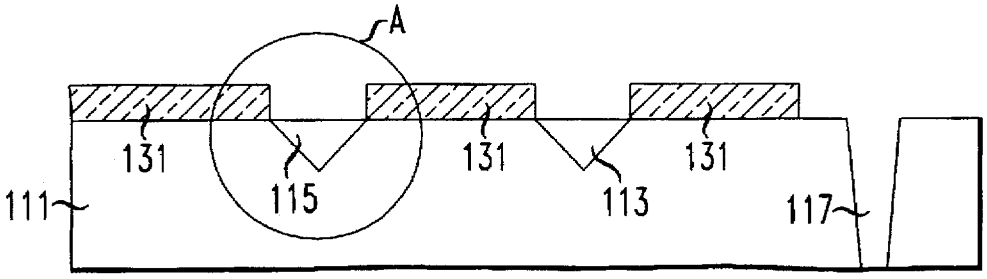
FIG. 3 (PRIOR ART)
Figure 4:
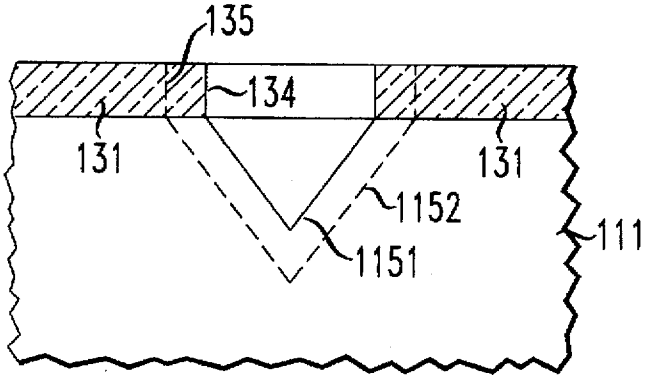
FIG. 4 (PRIOR ART)
FIG. 4 depicts the conventional method of forming v-grooves in which the etchant attacks the patterned oxide.

Since the thermal nitridation process prevents formation of an intermediate oxide layer, and since silicon nitride layer 141 is resistant to attack by the KOH etchant, the dimensional stability problems discussed in connection with FIGS. 3 and 4 are solved. Consequently, after formation of patterned silicon nitride layer 141, substrate 11 may be exposed to a KOH etchant and v-shaped grooves 15 and 13 may be formed simultaneously with the formation of channel 17. Formation of a channel 17 which extends through substrate 11 is accomplished by controlling the spacing, d, between portions of patterned silicon nitride layer 141. If spacing, d, is wide enough, the KOH etchant will etch completely through substrate 11, producing tapered channel 17. The spacing between silicon nitride layer 141 above the v-grooves 15 and 13, is, of course, smaller than dimension d.

Illustratively, the thickness of the wafer may be approximately 20 mils or 500 μm. The thickness of nitride layer 141 may be 50 Å. The width, w, of a typical v-groove 15, 13 may be 25–60 μm.

Figure 6:
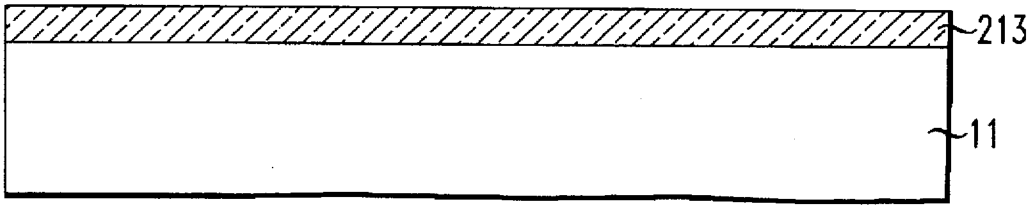
FIGS. 6 and 7 depict an alternative embodiment of the present invention in which a silicon dioxide layer and a thermal silicon nitride layer are formed on the substrate.

An alternative embodiment of the present invention is depicted in FIGS. 6–9. In FIG. 6, reference numeral 11 denotes a silicon substrate, similar to substrate as described. Reference numeral 213 denotes a silicon dioxide layer, having a thickness of approximately 7500 Å. Layer 213 is formed by oxidation of substrate 11 in an atmosphere of oxygen and hydrochloric acid or an atmosphere of steam at approximately 1050° C. The presence of oxide layer 213 tends to seal the edges of the wafer.

Figure 7:
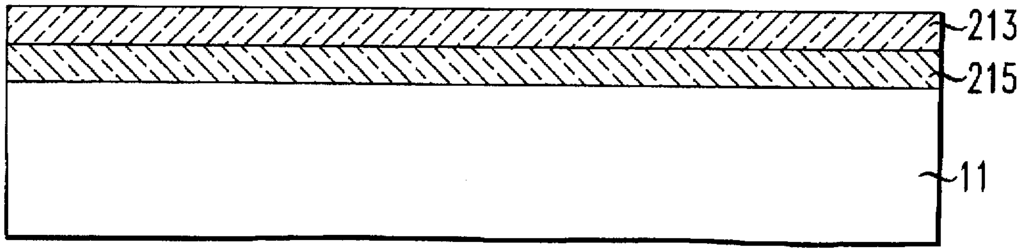

Turning to FIG. 7, a thermal nitridation process is performed by exposing substrate 11 to a mixture of 20% $NH_3$ and 80% $N_2$ at 1100° C. and atmospheric pressure. The thermal nitridation process produces a layer of silicon nitride 215 between silicon dioxide layer 213 and substrate 11. The previously-formed silicon dioxide layer 213 is displaced by the newly-formed silicon nitride layer 215.

Figure 8:
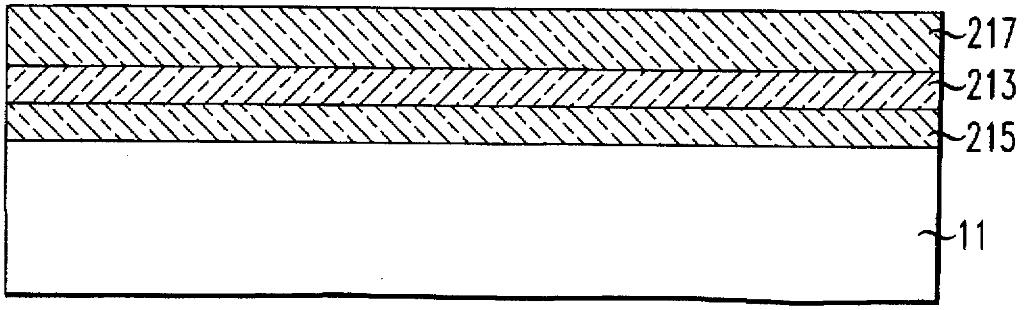
FIG. 8 depicts an alternative embodiment with an overlying layer for scratch protection.

Finally, turning to FIG. 8, an overlying layer 217 of either LPCVD silicon nitride or polysilicon is formed for scratch protection.

Figure 9:
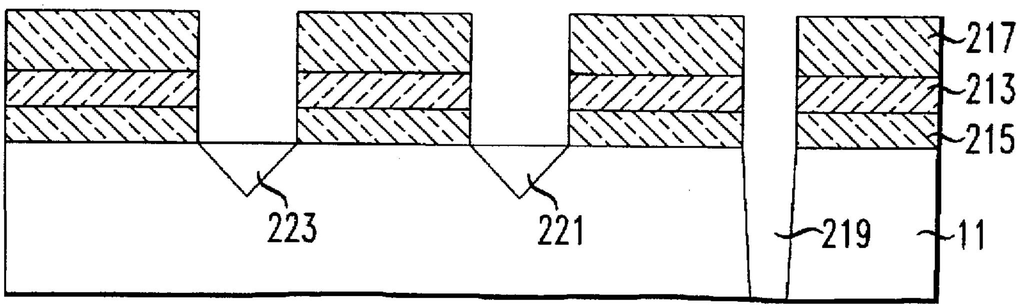
FIG. 9 depicts an alternative embodiment in which patterned overlying, silicon dioxide, and thermal silicon nitride layers are used in the formation of v-grooves or channels in the substrate.

Next, in FIG. 9, layers 217, 213, and 215 are patterned (by deposition of a photoresist, exposure of the photoresist, removal of the unwanted portions of the photoresist, a plasma etch, and stripping of the resist). Then a KOH etch is performed for 3.5 hours at 95° C. to form channel 219 and v-grooves 223 and 221. Finally, layers 217, 213, and 215 are removed in a 1:1 HF—$H_2O$ acid bath.

The inventive process is illustratively practiced with semiconductor wafers, such as those used for integrated circuit manufacture. A plurality of channel plates are formed upon a single wafer. Then the wafer is sawed, and individual channel plates are obtained for eventual combination with heater plates.

The present process may also find use in the formation of v-grooves or trenches which may be utilized for semiconductor device isolation in the formation of integrated circuits. (The v-groove may be formed as previously described. Then the groove may be filled with LPCVD oxide which is formed, for example from TEOS. Alternatively, the groove may be subjected to an oxidizing ambient to grow an oxide within the v-groove.)

The invention claimed is:

1. A method of wafer processing comprising:
   forming a layer of silicon nitride ≦50 angstroms thick by a thermal nitridation process upon a silicon substrate;
   patterning said layer of silicon nitride to expose portions of said substrate; and
   etching said exposed portions of said substrate to produce at least one v-shaped groove.

2. The method of claim 1 in which said etching process etches through said substrate.

3. The method of claim 1 in which said etching process is performed in KOH.

4. The method of claim 1 in which said thermal nitridation process comprises: exposing said substrate to at least one of a gas chosen from the group consisting of $NH_3$ and $N_2$ at atmospheric pressure at a temperature between 900° C. and 1200° C.

5. The method of claim 1 in which a layer of silicon dioxide is formed on said silicon substrate prior to said forming of said layer of silicon nitride.

6. A method of forming a channel plate comprising:
   forming a layer of silicon dioxide upon a silicon wafer by exposing said wafer to an atmosphere of oxygen and hydrochloric acid at a temperature of approximately 1050° C.;
   forming a layer of silicon nitride ≦50 angstroms thick between said layer of silicon dioxide and said silicon wafer by a thermal nitridation process which includes exposing said wafer to an atmosphere of 20% $NH_3$ and 80% of $N_2$ at approximately 1100° C. and atmospheric pressure;
   forming a material layer over said layer of silicon dioxide, said material being chosen from the group consisting of silicon nitride and polysilicon;
   patterning said material layer and said layer of silicon dioxide and said layer of silicon nitride;
   exposing said wafer to KOH to form two or more v-grooves;
   removing said patterned material layer and said layer of silicon dioxide and said layer of silicon nitride;
   sawing said wafer to form at least one channel plate.

7. The method of claim 1 in which said layer of silicon nitride has a thickness of 50 angstroms.

8. The method of claim 6 in which said layer of silicon nitride has a thickness of 50 angstroms.

* * * * *